(12) United States Patent
Liu (10) Patent No.: US 12,446,429 B2
(45) Date of Patent: Oct. 14, 2025

(54) DISPLAY PANEL AND DISPLAY DEVICE (71) Applicant: TCL CHINA STAR OPTOELECTRONICS TECHNOLOGY CO., LTD., Guangdong (CN)

(72) Inventor: Jing Liu, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/758,016

(22) PCT Filed: May 31, 2022

(86) PCT No.: PCT/CN2022/096197
§ 371 (c)(1),
(2) Date: Jun. 26, 2022

(87) PCT Pub. No.: WO2023/221167
PCT Pub. Date: Nov. 23, 2023

(65) Prior Publication Data
US 2024/0196687 A1    Jun. 13, 2024

(30) Foreign Application Priority Data
May 18, 2022    (CN) .......................... 202210544092.4

(51) Int. Cl.
*H10K 59/35* (2023.01)
*G02F 1/13357* (2006.01)
*H10K 59/38* (2023.01)

(52) U.S. Cl.
CPC ..... *H10K 59/353* (2023.02); *G02F 1/133615* (2013.01); *H10K 59/38* (2023.02)

(58) Field of Classification Search
CPC . H10K 59/353; H10K 59/38; G02F 1/133615
See application file for complete search history.

(56) References Cited

U.S. PATENT DOCUMENTS

| 5,965,907 A | 10/1999 | Huang et al. |
| 2006/0187378 A1* | 8/2006 | Bong ................ G02F 1/133603 349/69 |

(Continued)

FOREIGN PATENT DOCUMENTS

| CN | 106531775 A | 3/2017 |
| CN | 107564944 A | 1/2018 |

(Continued)

OTHER PUBLICATIONS

Min et al., CN 109085717, Dec. 25, 2018 (Year: 2018).*

(Continued)

*Primary Examiner* — Mary Ellen Bowman
(74) *Attorney, Agent, or Firm* — PV IP PC; Wei Te Chung (57) ABSTRACT

A display panel and a display device are provided. By applying organic light-emitting diodes to backlight technology, the light-emitting functional layer includes a plurality of light-emitting units. The light-emitting unit includes at least one millimeter-scale sub-pixel. Thus, a process flow and a mass production difficulty of organic light-emitting diodes in the prior art are reduced, and a manufacturing efficiency is improved.

18 Claims, 2 Drawing Sheets

(56) References Cited

U.S. PATENT DOCUMENTS

| | | | |
|---|---|---|---|
| 2014/0226110 A1* | 8/2014 | Doyle | G02F 1/133603 349/69 |
| 2017/0125740 A1* | 5/2017 | Lee | H10K 59/8792 |
| 2019/0131350 A1* | 5/2019 | Kwak | H10K 59/878 |
| 2019/0196272 A1* | 6/2019 | Johnson | G02F 1/133382 |

FOREIGN PATENT DOCUMENTS

| | | | |
|---|---|---|---|
| CN | 107966857 | A | 4/2018 |
| CN | 208141087 | U | 11/2018 |
| CN | 110543050 | A | 12/2019 |
| CN | 111508994 | A | 8/2020 |
| CN | 111864088 | A | 10/2020 |
| CN | 111965907 | A | 11/2020 |
| CN | 113270455 | A | 8/2021 |
| CN | 113805379 | A | 12/2021 |

OTHER PUBLICATIONS

International Search Report in International application No. PCT/CN2022/096197, mailed on Dec. 19, 2022.

Written Opinion of the International Search Authority in International application No. PCT/CN2022/096197, mailed on Dec. 19, 2022.

Chinese Office Action issued in corresponding Chinese Patent Application No. 202210544092.4 dated Apr. 12, 2023, pp. 1-7.

\* cited by examiner

DISPLAY PANEL AND DISPLAY DEVICE

FIELD OF INVENTION

The present application relates to the field of display technology, and in particular, to a display panel and a display device.

BACKGROUND OF INVENTION

Organic light-emitting diode (OLED) is a current-type organic light-emitting device. A luminescence of OLED is induced by an injection and a recombination of carriers, wherein a luminous intensity of the OLED is proportional to an injected current. The OLED technology is usually used in direct display technology, because of its many advantages such as self-illumination, wide viewing angle, high contrast, etc. Therefore, OLED is considered to be a next generation display technology.

With an increasing demand of consumers for high pixel density, sub-millimeter pixel size is required, which increases a difficulty of manufacturing process of the OLED display panel. A difficulty of corresponding process is increased exponentially as the display panel size becomes larger and larger.

SUMMARY OF INVENTION

Embodiments of the present application provide a display panel and a display device to alleviate the deficiencies in the related art.

In order to realize the above functions, the technical solutions provided by the embodiments of the present application are as follows:

Embodiments of the present application provide a display panel, including:
- a display panel main body including a display region;
- a backlight module positioned on a backlight side of the display panel main body and opposite to the display region, wherein the backlight module includes a base substrate;
- an organic light-emitting diode disposed on a side of the base substrate close to the display panel main body, wherein the organic light-emitting diode includes a first electrode, a second electrode oppositely to the first electrode, at least one light-emitting functional layer positioned between the first electrode and the second electrode, wherein the light-emitting functional layer includes a plurality of light-emitting units, and wherein the light-emitting unit includes at least one millimeter-scale sub-pixel.

In the display panel provided by the embodiment of the present application, the light-emitting functional layer includes a light-emitting layer, and wherein a material of the light-emitting layer includes one of a red light-emitting material, a green light-emitting material, and a blue light-emitting material;
wherein the light-emitting unit includes two millimeter-scale sub-pixels, and wherein the two sub-pixels have a same color;
wherein the display panel further includes a light conversion layer positioned between the display panel main body and the backlight module, and wherein an orthographic projection of the light conversion layer on the base substrate covers the backlight module; and
wherein the light conversion layer includes a base layer and different types of fluorescent materials uniformly dispersed on the base layer, and wherein the fluorescent materials include at least two of a red fluorescent material, a green fluorescent material, and a blue fluorescent material.

In the display panel provided in the embodiment of the present application, a material of the light conversion layer is a quantum dot material, wherein the light conversion layer is disposed on the display panel main body or the backlight module.

In the display panel provided in the embodiment of the present application, the organic light-emitting diode includes a plurality of the light-emitting functional layers stacked between the first electrode and the second electrode, wherein a charge generating layer is disposed between two adjacent light-emitting functional layers.

In the display panel provided by the embodiment of the present application, the light-emitting functional layer includes a first common layer, a light-emitting layer, and a second common layer stacked on the first electrode, and wherein a material of the light-emitting layer includes one or two of a red light-emitting material, a green light-emitting material, and a blue light-emitting material.

In the display panel provided in the embodiment of the present application, the light-emitting unit includes two millimeter-scale sub-pixels, and the two sub-pixels have the same color.

In the display panel provided in the embodiment of the present application, the plurality of light-emitting functional layers include a first light-emitting functional layer and a second light-emitting functional layer arranged in layers;
wherein the first light-emitting functional layer includes a plurality of first light-emitting units, wherein the first light-emitting unit includes two millimeter-scale first sub-pixels, wherein the second light-emitting functional layer includes a plurality of second light-emitting units, wherein the second light-emitting unit includes two millimeter-scale second sub-pixels; and
wherein a color of the first sub-pixel is the same as a color of the second sub-pixel In the display panel provided in the embodiment of the present application, the plurality of light-emitting functional layers include a first light-emitting functional layer and a second light-emitting functional layer arranged in layers;
wherein the first light-emitting functional layer includes a plurality of first light-emitting units, wherein the first light-emitting unit includes two millimeter-scale first sub-pixels, wherein the second light-emitting functional layer includes a plurality of second light-emitting units, wherein the second light-emitting unit includes two millimeter-scale second sub-pixels; and
wherein a color of the first sub-pixel is different from a color of the second sub-pixel.

In the display panel provided in the embodiment of the present application, the plurality of light-emitting functional layers include a first light-emitting functional layer, a second light-emitting functional layer, and a third light-emitting functional layer which are arranged in layers;
wherein the first light-emitting functional layer includes a plurality of first light-emitting units, wherein the first light-emitting unit includes two millimeter-scale first sub-pixels, wherein the second light-emitting functional layer includes a plurality of second light-emitting units, wherein the second light-emitting unit includes two millimeter-scale second sub-pixels, wherein the third light-emitting functional layer includes a plurality of third light-emitting units, and wherein the third light-emitting unit includes two millimeter-scale third sub-pixels; and wherein the first sub-pixel displays a first color, the second sub-pixel displays a second color, and the third sub-pixel displays a third color.

In the display panel provided by the embodiment of the present application, the light-emitting unit includes two millimeter-scale sub-pixels, and wherein a distance between the two sub-pixels ranges from 0.8 mm to 8 mm.

An embodiment of the present application provides a display device, the display device including a display panel, wherein the display panel includes:

a display panel main body including a display region;
a backlight module positioned on a backlight side of the display panel main body and opposite to the display region, wherein the backlight module includes
a base substrate;
an organic light-emitting diode disposed on a side of the base substrate close to the display panel main body, wherein the organic light-emitting diode includes a first electrode, a second electrode oppositely to the first electrode, at least one light-emitting functional layer positioned between the first electrode and the second electrode, wherein the light-emitting functional layer includes a plurality of light-emitting units, and wherein the light-emitting unit includes at least one millimeter-scale sub-pixel.

In the display device provided in the embodiment of the present application, the light-emitting functional layer includes a light-emitting layer, and wherein a material of the light-emitting layer includes one of a red light-emitting material, a green light-emitting material, and a blue light-emitting material;

wherein the light-emitting unit includes two millimeter-scale sub-pixels, and wherein the two sub-pixels have a same color;
wherein the display panel further includes a light conversion layer positioned between the display panel main body and the backlight module, and wherein an orthographic projection of the light conversion layer on the base substrate covers the backlight module; and
wherein the light conversion layer includes a base layer and different types of fluorescent materials uniformly dispersed on the base layer, and wherein the fluorescent materials include at least two of a red fluorescent material, a green fluorescent material, and a blue fluorescent material.

In the display device provided by the embodiments of the present application, a material of the light conversion layer is a quantum dot material, wherein the light conversion layer is disposed on the display panel main body or the backlight module.

In the display device provided by the embodiment of the present application, the organic light-emitting diode includes a plurality of the light-emitting functional layers stacked between the first electrode and the second electrode, wherein a charge generating layer is disposed between two adjacent light-emitting functional layers.

In the display device provided by the embodiments of the present application, the light-emitting functional layer includes a first common layer, a light-emitting layer, and a second common layer stacked on the first electrode, and wherein a material of the light-emitting layer includes one or two of a red light-emitting material, a green light-emitting material, and a blue light-emitting material.

In the display device provided by the embodiment of the present application, the light-emitting unit includes two millimeter-scale sub-pixels, and the two sub-pixels have the same color.

In the display device provided by the embodiments of the present application, the plurality of light-emitting functional layers include a first light-emitting functional layer and a second light-emitting functional layer arranged in layers;

wherein the first light-emitting functional layer includes a plurality of first light-emitting units, wherein the first light-emitting unit includes two millimeter-scale first sub-pixels, wherein the second light-emitting functional layer includes a plurality of second light-emitting units, wherein the second light-emitting unit includes two millimeter-scale second sub-pixels, and wherein a color of the first sub-pixel is the same as a color of the second sub-pixel;
wherein the display panel further includes a light conversion layer positioned between the display panel main body and the backlight module, and wherein an orthographic projection of the light conversion layer on the base substrate covers the backlight module; and
wherein the light conversion layer includes a base layer and different types of fluorescent materials uniformly dispersed on the base layer, and wherein the fluorescent materials include at least two of a red fluorescent material, a green fluorescent material, and a blue fluorescent material.

In the display device provided by the embodiments of the present application, the plurality of light-emitting functional layers include a first light-emitting functional layer and a second light-emitting functional layer arranged in layers;

wherein the first light-emitting functional layer includes a plurality of first light-emitting units, wherein the first light-emitting unit includes two millimeter-scale first sub-pixels, wherein the second light-emitting functional layer includes a plurality of second light-emitting units, wherein the second light-emitting unit includes two millimeter-scale second sub-pixels, and wherein a color of the first sub-pixel is different from a color of the second sub-pixel;
wherein the display panel further includes a light conversion layer positioned between the display panel main body and the backlight module, and wherein an orthographic projection of the light conversion layer on the base substrate covers the backlight module; and
wherein the light conversion layer includes a base layer and different types of fluorescent materials uniformly dispersed on the base layer, and wherein the fluorescent materials include at least one of a red fluorescent material, a green fluorescent material, and a blue fluorescent material.

In the display device provided by the embodiments of the present application, the plurality of light-emitting functional layers include a first light-emitting functional layer, a second light-emitting functional layer, and a third light-emitting functional layer which are arranged in layers;

wherein the first light-emitting functional layer includes a plurality of first light-emitting units, wherein the first light-emitting unit includes two millimeter-scale first sub-pixels, wherein the second light-emitting functional layer includes a plurality of second light-emitting units, wherein the second light-emitting unit includes two millimeter-scale second sub-pixels, wherein the third light-emitting functional layer includes a plurality of third light-emitting units, and wherein the third light-emitting unit includes two millimeter-scale third sub-pixels; and wherein the first sub-pixel displays a first color, the second sub-pixel displays a second color, and the third sub-pixel displays a third color.

In the display device provided in the embodiment of the present application, the light-emitting unit includes two millimeter-scale sub-pixels, and wherein a distance between the two sub-pixels ranges from 0.8 mm to 8 mm.

In the embodiments of the present application, the backlight module in the display panel includes a stacked substrate and an organic light-emitting diode. The organic light-emitting diode includes a first electrode and a second electrode oppositely to the first electrode. At least one light-emitting functional layer is disposed between the first electrode and the second electrode. The light-emitting functional layer includes a plurality of light-emitting units. The light-emitting unit includes at least one millimeter-scale sub-pixel. Compared with the application of organic light-emitting diodes to display technology in the prior art, the embodiments of the present application apply organic light-emitting diodes to backlight technology, the light-emitting functional layer includes a plurality of light-emitting units, wherein the light-emitting unit includes at least one millimeter-scale sub-pixel, thereby reducing a process flow and a mass production difficulty of organic light-emitting diodes in the prior art, and improving a production efficiency of the OLED.

DESCRIPTION OF FIGURES

The technical solutions and other beneficial effects of the present application will be apparent through the detailed description of the specific embodiments of the present application in conjunction with the accompanying figures.

DETAILED DESCRIPTION OF EMBODIMENTS

The embodiments of the present application provide a display panel and a display device. In order to make a purpose, technical solutions and effects of the present application clearer and more specific, the present application will be further described below with reference to the accompanying figures and embodiments. It should be understood that the specific embodiments described herein are only used to explain the present application, but not to limit the present application.

Figure 2:
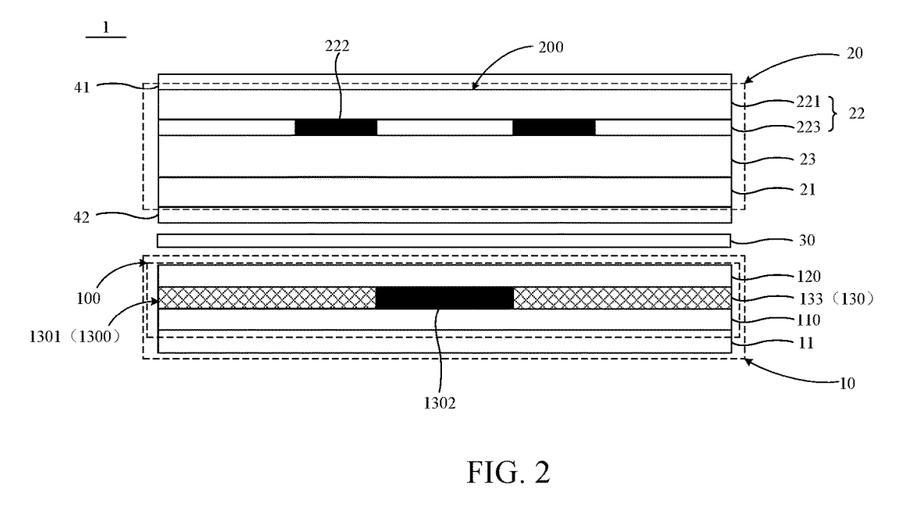
FIG. 2 is a schematic diagram of a first structure of a display panel provided by one embodiment of the present application.
Figure 3:
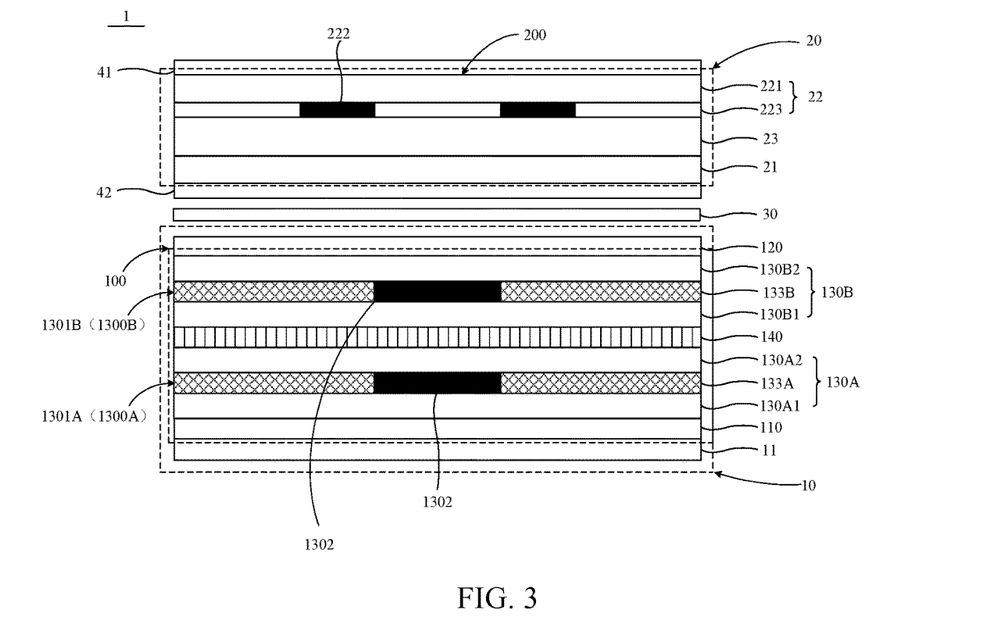
FIG. 3 is a schematic diagram of a second structure of the display panel provided by one embodiment of the present application.
Figure 4:
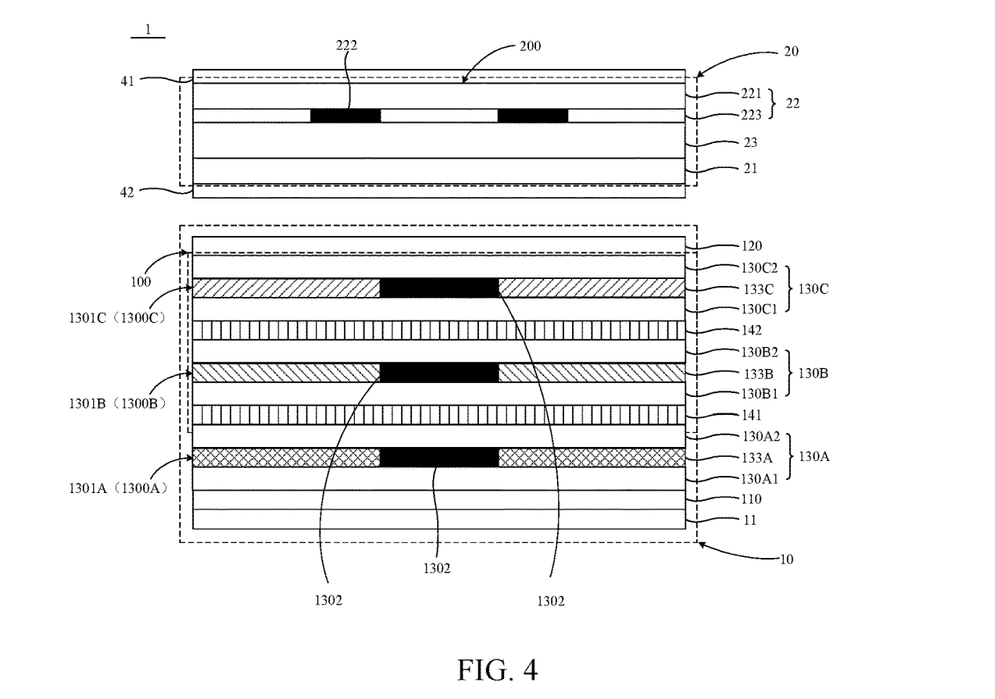
FIG. 4 is a schematic diagram of a third structure of the display panel provided by one embodiment of the present application.

Referring to FIG. 2 to FIG. 4, one embodiment of the present application provides a display panel and a display device. The display panel includes:

a display panel main body 20 including a display region 200;

a backlight module 10 positioned on a backlight side of the display panel main body 20 and opposite to the display region 200, wherein the backlight module 10 includes a base substrate 11;

an organic light-emitting diode 100 disposed on a side of the base substrate 11 close to the display panel main body 20, wherein the organic light-emitting diode 100 includes a first electrode 110, a second electrode 120 oppositely to the first electrode 110, at least one light-emitting functional layer 130 between the first electrode 110 and the second electrode 120, wherein the light-emitting functional layer 130 includes a plurality of light-emitting units 1300, and wherein the light-emitting unit 1300 includes at least one millimeter-scale sub-pixel 1301.

Figure 1:
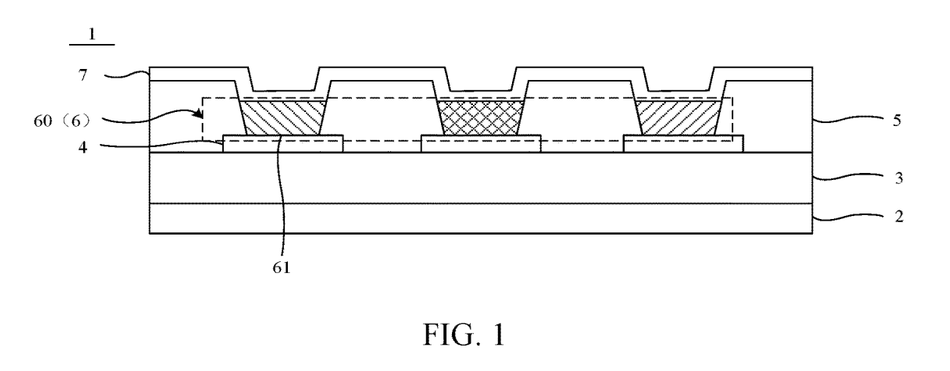
FIG. 1 is a schematic structural diagram of a conventional display panel.

It can be understood that the organic light-emitting diode 100 (OLED) has many advantages such as self-luminescence, wide viewing angle, high contrast, etc., so it is usually used in display technology. Please refer to FIG. 1, FIG. 1 is a schematic structural diagram of a conventional display panel. The display panel 1 is an organic light-emitting diode display panel. The display panel 1 includes a currently base substrate 2, a currently thin film transistor layer 3, a currently anode electrode 4, a currently pixel definition layer 5, a currently light-emitting functional layer 6, and a currently cathode layer 7. The currently light-emitting functional layer 6 includes a plurality of currently light-emitting units 60. The currently light-emitting unit 60 includes a plurality of currently sub-pixels 61 of different colors. The currently pixel definition layer 5 includes a plurality of openings, wherein one of the openings is provided with the currently sub-pixel 61. However, as consumers demand higher pixel density, sub-millimeter pixels are required size, which not only increases a difficulty of the manufacturing process of the display panel 1, but also increases a corresponding manufacturing difficulty exponentially as a size of the display panel 1 becomes larger and larger.

In the embodiment of the present application, the backlight module 10 in the display panel 1 is disposed to include a base substrate 11 and an organic light-emitting diode 100 arranged in layers. The organic light-emitting diode 100 includes a first electrode 110 and a second electrode 120 arranged opposite to each other, at least one light-emitting functional layer 130 positioned between the first electrode 110 and the second electrode 120. The light-emitting functional layer 130 includes a plurality of light-emitting units 1300. The light-emitting units 1300 at least include a millimeter-scale sub-pixel 1301. Compared with the application of the organic light-emitting diode 100 to the display technology in the prior art, the embodiment of the present application applies the organic light-emitting diode 100 to the backlight technology, the light-emitting functional layer 130 includes a plurality of light-emitting units 1300, and the light-emitting unit 1300 includes at least one millimeter-scale sub-pixel 1301, thereby reducing a process flow and a mass production difficulty of the organic light-emitting diode 100 in the prior art, and improving a manufacturing efficiency.

The technical solutions of the present application will now be described with reference to specific embodiments.

In one embodiment, please refer to FIG. 2, which is a schematic diagram of a first structure of the display panel provided by the embodiment of the present application.

This embodiment provides a display panel 1, and the display panel 1 includes but is not limited to a liquid crystal display panel (LCD). It should be noted that this embodiment takes a liquid crystal display panel as an example to describe a technical solution of the present application.

The display panel 1 includes a display panel main body 20 and a backlight module 10 positioned on a backlight side of the display panel main body 20. The display panel main body 20 includes a display region 200. The backlight module 10 is disposed opposite to the display region 200. The display panel main body 20 includes a first substrate 21 and a second substrate 22 disposed opposite to each other, and a liquid crystal layer 23 disposed between the first substrate 21 and the second substrate 22, wherein the liquid crystal layer 23 is composed of liquid crystal with liquid crystal molecules. The first substrate 21 and the second substrate 22 are fixed by a sealing member (not shown in the figure), and the liquid crystal is sealed in a closed space formed by the first substrate 21, the second substrate 22, and the sealing member. A material of the liquid crystal includes but is not limited to liquid crystal material with negative dielectric constant anisotropy.

In this embodiment, the first substrate 21 includes but is not limited to an array substrate, the second substrate 22 includes but is not limited to a color filter substrate. In this embodiment, the first substrate 21 is an array substrate, and the second substrate 22 is a color filter substrate as an example to describe the technical solution of the present application. At this time, the display panel 1 includes structures such as an array substrate, a color filter substrate, and a liquid crystal layer 23 sandwiched between the array substrate and the color filter substrate, which are well known to those skilled in the art, and the specific structures thereof will not be repeated here.

The backlight module 10 includes a base substrate 11 and an organic light-emitting diode 100 disposed on a side of the substrate 11 close to the display panel 1. The organic light-emitting diode 100 includes a first electrode 110 and a second electrode 120 disposed oppositely to the first electrode 110, and at least one light-emitting functional layer 130 positioned between the first electrode 110 and the second electrode 120, wherein the light-emitting functional layer 130 includes a plurality of light-emitting units 1300, and the light-emitting unit 1300 at least include a millimeter-scale sub-pixel 1301.

In this embodiment, the first electrode 110 includes but is not limited to an anode, and the second electrode 120 includes but is not limited to a cathode. In this embodiment, the technical solution of the present application is described by taking the first electrode 110 is an anode and the second electrode 120 is a cathode as an example.

It should be noted that, in this embodiment, the first electrode 110 and the second electrode 120 are connected through a DC power supply. The light-emitting functional layer 130 includes a light-emitting layer 133. A material of the light-emitting layer 133 includes one or two of a red light-emitting material, a green light-emitting material, and a blue light-emitting material. The light-emitting functional layer further includes a hole transport layer positioned between the light-emitting layer and the first electrode, and a hole transport layer located between the light-emitting layer and the first electrode, and an electron transport layer positioned between the light-emitting layer and the second electrode. Preferably, the material of the light-emitting layer 133 is a blue light-emitting material. Under an action of the electric field of the organic light-emitting diode 100, the holes generated by the first electrode 110 and the electrons generated by the second electrode 120 will move, and are injected into the hole transport layer and the electron transport layer, respectively, and migrate to the light-emitting layer 133, energy excitons are generated when the two meet in the light-emitting layer 133, thereby exciting the light-emitting molecules to finally generate visible light.

In this embodiment, the backlight module 10 includes the base substrate 11 and the organic light-emitting diode 100 that are stacked in layers, and the organic light-emitting diode 100 includes a first electrode 110, a second electrode 120 disposed opposite to the first electrode 110, and at least one light-emitting functional layer 130 positioned between the first electrode 110 and the second electrode 120. The light-emitting functional layer 130 includes a plurality of light-emitting units 1300, and the light-emitting units 1300 include at least one millimeter-scale sub-pixel 1301. Compared with the application of the organic light-emitting diode 100 to the display technology in the prior art, by applying the organic light-emitting diode 100 to the backlight technology in this embodiment, the light-emitting functional layer 130 includes a plurality of light-emitting units 1300, and the light-emitting units 1300 includes at least one millimeter-scale sub-pixel 1301, thereby reducing a process flow and mass production difficulty of the organic light-emitting diode 100 in the prior art, and improving a manufacturing efficiency.

At the same time, it can be understood that since the liquid crystal display panel itself does not emit light, it is necessary to use the backlight provided by the backlight module 10 to display the picture normally. In the currently backlight module 10 technology, both a direct type backlight module 10 and an edge type backlight module use light-emitting diodes (LED) as the backlight source. The most common is the white light LED lamp as the backlight source, but it is not obvious that a brightness of the display is improved by using the LED lamp as the backlight source. Therefore, in the present application, the backlight module 10 is set to include the organic light-emitting diode 100, so that the display can be displayed. The display effect of the panel 1 is better, and the present application also has the characteristics of simple structure.

Further, in this embodiment, the light-emitting unit 1300 includes two millimeter-scale sub-pixels 1301, and the two sub-pixels 1301 have the same color, that is, the light-emitting functional layer 130 is a non-integral type Continuous film layer; the display panel 1 further includes a light conversion layer 30 located between the display panel main body 20 and the backlight module 10, and the orthographic projection of the light conversion layer 30 on the substrate 11 covers all The backlight module 10; it should be noted that, in this embodiment, the distance between the two sub-pixels 1301 ranges from 0.8 mm to 8 mm, so as to improve the purity of the light emitted by the backlight module 10; it is understandable Yes, the size of the distance between the two sub-pixels 1301 may be determined by the process requirements during actual fabrication, and the display panel of the present embodiment does not specifically limit the distance between the two sub-pixels 1301.

The light conversion layer 30 includes a base layer (not shown in the figure), and different types of fluorescent materials uniformly dispersed on the base substrate. The fluorescent materials include at least two of a red fluorescent material, a green fluorescent material, and a blue fluorescent material. It should be noted that the light conversion layer 30 may be disposed on the display panel main body 20 or on the backlight module 10, which is not specifically limited in this embodiment.

In this embodiment, a first black matrix 1302 is disposed between the two sub-pixels 1301, and the sub-pixels 1301 are defined by the first black matrix 1302. The backlight module 10 further includes driving elements (not shown in the figure) corresponding to the two sub-pixels 1301 one-to-one. For example, a thin film transistor layer is provided between the substrate 11 and the organic light-emitting diode 100. The thin film transistor layer includes thin film transistors connected to the sub-pixels 1301 in one-to-one correspondence, and each of the sub-pixels 1301 emits light under the driving of the corresponding thin film transistor. It should be noted that the thin-film transistors include but are not limited to low-temperature polysilicon thin-film transistors, which is not specifically limited in this embodiment.

It can be understood that, in this embodiment, the light-emitting unit 1300 is configured to include two millimeter-scale sub-pixels 1301. The light-emitting functional layer 130 includes two sub-pixel regions. Each of sub-pixel region is provided with one sub-pixel 1301 and a thin film transistor correspondingly connected to the sub-pixel 1301, therefore, the sub-pixel 1301 can be controlled by sub-region dimming, so that the display panel main body 20 opposite to the sub-pixel 1301 can present rich dynamic brightness and contrast ratio. It should be noted that this embodiment does not specifically limit a method of dimming controlling the sub-pixel 1301.

It should be noted that, in this embodiment, the light emitted by the organic light-emitting diode 100 becomes white light under an excitation of the light conversion layer 30, or the light conversion layer 30 generates white light under an excitation of the light emitted by the organic light-emitting diode. That is, the light conversion layer 30 is configured to convert the light emitted by the backlight module 10 to the display panel main body 20 into white light, and a method of converting white light is not specific limited in this embodiment.

Specifically, a material of the substrate 11 layer includes but not limited to transparent resin, such as silicone resin, epoxy resin or other materials. A material of the light conversion layer 30 includes but not limited to quantum dot material and fluorescent material, preferably, the material of the light conversion layer 30 is a fluorescent material, and the fluorescent material is used to convert light of a certain wavelength into output light of a specific wavelength. It can be understood that this embodiment does not limit a type of the fluorescent material.

In this embodiment, both of the two sub-pixels 1301 emit light of a first color, wherein the first color includes but is not limited to blue, red, and green. In one embodiment, the light conversion layer 30 may include red fluorescent material and green fluorescent material to output white light when the group 10 emits blue light. in one embodiment, the light conversion layer 30 may include blue fluorescent material and green fluorescent material to output white light when the backlight module 10 emits red light. In one embodiment, the light conversion layer 30 may include red fluorescent material and blue fluorescent material to output white light when the backlight module 10 emits green light.

It can be understood that, in this embodiment, an orthographic projection of the light conversion layer 30 on the base substrate 11 covers the backlight module 10. The light conversion layer 30 is configured to convert the light emitted by the backlight module 10 to the display panel main body 20 into white light, so as to provide backlight for the display panel main body 20.

In this embodiment, the display panel 1 further includes a first polarizer 41 positioned on a side of the display panel body 20 away from the backlight module 10, and a second polarizer 42 positioned on the display panel body 20 close to the backlight module 10. The first polarizer 41 and the second polarizer 42 are well known to those skilled in the art, and their specific structures will not be repeated here.

The display panel body 20 further includes a second black matrix 222 and a color filter 223. The color filter 223 includes but is not limited to a red filter, a green filter, and a blue filter. Preferably, the second substrate 22 includes a second base substrate 221 and the black matrix 222 and the color filter 223 which are disposed on a side of the second base substrate 221 close to the first substrate 21. The second black matrix 222 includes a plurality of opening regions, wherein the color filter 223 is disposed in the opening regions. It is understood that the second substrate 22 includes the second black matrix 222 and the color filter 223 is only used for illustration, and the positions of the second black matrix 222 and the color filter 223 in this embodiment are not specifically limited.

It should be noted that, in another embodiment, the fluorescent material includes at least one of red fluorescent material, green fluorescent material, and the blue fluorescent material to output white light when the two sub-pixels 1301 have different colors, that is, when the two sub-pixels 1301 emit light of different colors. In another embodiment, the fluorescent material includes red fluorescent material, green fluorescent material and blue fluorescent material to output white light when both of the sub-pixels 1301 are white sub-pixels 1301, that is, when both of the sub-pixels 1301 emit white light.

Please refer to FIG. 3, FIG. 3 is a schematic diagram of a second structure of the display panel provided by the embodiment of the present application.

In this embodiment, the structure of the display panel 1 is similar/identical to the first structure of the display panel provided in the above-mentioned embodiment. For details, please refer to the description of the display panel in the above-mentioned embodiment, and details are not repeated here. The only difference between the two is:

In this embodiment, the organic light-emitting diode 100 includes a plurality of the light-emitting functional layers 130 stacked between the first electrode 110 and the second electrode 120. A charge generation layer 140 is provided between two adjacent light-emitting functional layers 130.

It can be understood that, in this embodiment, a series of organic light-emitting diodes 100 (Tandem OLEDs) are used to stack a plurality of independent light-emitting functional layers 130, so that a current of a same magnitude passes through the plurality of different light-emitting units 1300 to commonly emit light to improve a luminous brightness and an efficiency of the series organic light-emitting diode 100. Compared with the traditional single organic light-emitting diode 100, the current efficiency and luminous brightness of the series organic light-emitting diode 100 are doubled, and under a same brightness, the current density of the series organic light-emitting diode 100 is also lower, thereby increasing the efficiency and the lifetime of the organic light-emitting diode 100. In addition, by using the charge generation layer (CGL) 140 as a connecting layer to connect a plurality of the light-emitting functional layers 130 together, a brighter light-emitting brightness can be achieved.

It should be noted that, in this embodiment, the charge generation layer 140 is well known to those skilled in the art. For example, the structure of the charge generation layer 140 is n-electron transport layer (n-ETL)/metal oxide or hexanitrilehexaazatriphenylene, hexanitrile hexaazatriphenylene (HATCN)/p-hole transport layer (p-HTL).

In this embodiment, the light-emitting unit 1300 includes two millimeter-scale sub-pixels 1301, and the two sub-pixels 1301 have a same color. Further, the plurality of light-emitting functional layers 130 include a first light-emitting functional layer 130A and a second light-emitting functional layer 130B. The charge generating layer 140 is positioned between the first light-emitting functional layer 130A and the second light-emitting functional layer 130B. The first light-emitting functional layer 130A includes a first common layer 130A1, a first light-emitting layer 133A, and a second common layer 130A2 stacked on the first electrode 110. The second light-emitting functional layer 130B includes a third common layer 130B1, a second light-emitting layer 133B, and a fourth common layer 130B2 stacked on the first light-emitting functional layer 130A. The charge generation layer 140 is positioned between the second common layer 130A2 and the third common layer 130B1.

The first common layer 130A1 and the third common layer 130B1 include but are not limited to a hole transport layer, the second common layer 130A2 and the fourth common layer 130B2 include but are not limited to an electron transport layer. The charge generation layer 140 is configured to provide the first light-emitting layer 133A and the second light-emitting layer 133B with electrons or holes required for light emission, respectively, causing the first light-emitting layer 133A to emit light under an action of the charge generation layer 140 and the first electrode 110. The second light-emitting layer 133B emits light under an action of the first electrode 110, and the second light-emitting layer 133B emits light under the action of the charge generation layer 140 and the second electrode 120, thus, the series-type organic light-emitting diode 100 can be realized, and the luminous efficiency can be increased.

Specifically, the first light-emitting functional layer 130A includes a plurality of first light-emitting units 1300A, the first light-emitting unit 1300A includes two millimeter-scale first sub-pixels 1301A. The second light-emitting functional layer 130B includes a plurality of second light-emitting units 1300B. The second light-emitting unit includes two millimeter-scale second sub-pixels 1301B. A color of the first sub-pixel 1301A and a color of the second sub-pixel 1301B are the same.

It can be understood that, in this embodiment, the organic light-emitting diode 100 includes the first light-emitting functional layer 130A, the charge generating layer 140, and the second light-emitting functional layer 130B arranged in layers, thus, the series-type organic light-emitting diode 100 is realized, and the efficiency and lifespan of the organic light-emitting diode 100 are increased. Further, by setting the color of the first sub-pixel 1301A and the color of the second sub-pixel 1301B to be the same, thereby increasing a brightness of the organic light-emitting diode 100 while reducing a difficulty of a manufacturing process.

Further, the display panel 1 further includes a light conversion layer 30 positioned between the display panel main body 20 and the backlight module 10, and an orthographic projection of the light conversion layer 30 on the substrate 11 covers the backlight module 10. The light conversion layer 30 includes a base layer and different types of fluorescent materials uniformly dispersed on the substrate, the fluorescent materials include at least two of a red fluorescent material, a green fluorescent material, and a blue fluorescent material.

Specifically, in this embodiment, the first sub-pixel 1301A includes but is not limited to a red sub-pixel 1301, a green sub-pixel 1301, and a blue sub-pixel 1301. The second sub-pixel 1301B includes but is not limited to a red sub-pixel 1301, a green sub-pixel 1301, and a blue sub-pixel 1301. Preferably, the first sub-pixel 1301A and the second sub-pixel 1301B are both blue sub-pixel 1301. The fluorescent materials include a red fluorescent material and a green fluorescent material to convert the light emitted by the backlight module 10 to the display panel main body 20 into white light.

It can be understood that the first sub-pixel 1301A and the second sub-pixel 1301B are both blue sub-pixels 1301. The fluorescent materials include a red fluorescent material and a green fluorescent material are only used for illustration. There is no specific restriction on this.

It should be noted that, in another embodiment, a plurality of the light-emitting functional layers 130 include a first light-emitting functional layer 130A and a second light-emitting functional layer 130B arranged in layers. The first light-emitting functional layer 130A includes a plurality of first light-emitting functional layers 130A. The first light-emitting unit 1300A includes two millimeter-scale first sub-pixels 1301A. The second light-emitting functional layer 130B includes a plurality of second light-emitting units 1300B. The second light-emitting unit 1300B includes two millimeter-scale second sub-pixels 1301B, and wherein a color of the first sub-pixel 1301A is different from a color of the second sub-pixel 1301B.

Further, the display panel 1 further includes a light conversion layer 30 positioned between the display panel main body 20 and the backlight module 10. An orthographic projection of the light conversion layer 30 on the base substrate 11 covers the backlight module 10. The light conversion layer 30 includes a base layer and different types of fluorescent materials uniformly dispersed on the base layer, and wherein the fluorescent materials include at least one of a red fluorescent material, a green fluorescent material, and a blue fluorescent material.

Specifically, in this embodiment, the first sub-pixel 1301A includes but is not limited to a red sub-pixel 1301, a green sub-pixel 1301, and a blue sub-pixel 1301. The second sub-pixel 1301B includes but is not limited to a red sub-pixel 1301, green sub-pixel 1301 and blue sub-pixel 1301. Preferably, the first sub-pixel 1301A is a blue sub-pixel 1301, the second sub-pixel 1301B is a red sub-pixel 1301, and the fluorescent material includes green fluorescent material to convert the light emitted by the backlight module 10 to the display panel main body 20 into white light.

It can be understood that the first sub-pixel 1301A is a blue sub-pixel 1301, the second sub-pixel 1301B is a red sub-pixel 1301, and the fluorescent material includes a green fluorescent material is only for illustration, and this embodiment does not specifically limit this.

Please refer to FIG. 4, which is a schematic diagram of a third structure of the display panel provided by the embodiment of the present application.

In this embodiment, the structure of the display panel is similar/same as the second structure of the display panel provided in the above-mentioned embodiment. For details, please refer to the description of the display panel in the above-mentioned embodiment, which will not be repeated here. The only difference is that:

In this embodiment, the plurality of the light-emitting functional layers 130 include a first light-emitting functional layer 130A, a second light-emitting functional layer 130B, and a third light-emitting functional layer 130C which are arranged in layers. The first light-emitting functional layer 130A includes a plurality of first light-emitting units 1300A. The first light-emitting unit 1300A includes two millimeter-scale first sub-pixels 1301A. The second light-emitting functional layer 130B includes a plurality of second light-emitting units 1300B. The second light-emitting unit 1300B includes two millimeter-scale second sub-pixels 1301B. The third light-emitting functional layer 130C includes a plurality of third light-emitting units 1300C. The third light-emitting unit 1300C includes two millimeter-scale third sub-pixels 1301C. The first sub-pixel 1301A displays a first color, the second sub-pixel 1301B displays a second color, and the third sub-pixel 1301C displays a third color.

The third light-emitting functional layer 130C includes a fifth common layer 130C1, a third light-emitting layer 133C, and a sixth common layer 130C2 stacked on the second light-emitting functional layer 130B. The fifth common layer 130C1 includes but not limited to a hole transport layer, the sixth common layer 130C2 includes but is not limited to an electron transport layer. A first charge generation layer 141 is disposed between the second common layer 130A2 and the third common layer 130B1. A second charge generation layer 142 is disposed between the fourth common layer 130B2 and the fifth common layer 130C1.

Specifically, in this embodiment, the first sub-pixel 1301A includes but is not limited to a red sub-pixel 1301, a green sub-pixel 1301, and a blue sub-pixel 1301. The second sub-pixel 1301B includes but is not limited to a red sub-pixel 1301, a green sub-pixel 1301, and a blue sub-pixel 1301. The third sub-pixel 1301C includes but is not limited to a red sub-pixel 1301, a green sub-pixel 1301, and a blue sub-pixel 1301. Preferably, the first sub-pixel 1301A is a blue sub-pixel 1301, the second sub-pixel 1301B is a red sub-pixel 1301, and the third sub-pixel 1301C is a green sub-pixel 1301.

It can be understood that, in this embodiment, by setting the first sub-pixel 1301A to be a blue sub-pixel 1301, the second sub-pixel 1301B to be a red sub-pixel 1301, and the third sub-pixel 1301C to be a green sub-pixel 1301. Therefore, the backlight module 10 emits white light to the display panel main body 20. Compared with the above-mentioned embodiment, the display panel 1 in this embodiment does not need to be provided with a light conversion layer 30, thereby reducing a thickness of the display panel 1, which simplifies a manufacturing process of the display panel 1.

This embodiment provides a display device, and the display device includes the display panel described in any of the above-mentioned embodiments.

It can be understood that, the display panel has been described in detail in the above embodiments, and the description will not be repeated here.

In specific applications, the display device may be a display screen of a smart phone, a tablet computer, a notebook computer, a smart bracelet, a smart watch, smart glasses, a smart helmet, a desktop computer, a smart TV or a digital camera, etc. even can be applied to electronic devices which having flexible displays.

In the embodiments of the present application, the backlight module in the display panel includes a stacked substrate and an organic light-emitting diode. The organic light-emitting diode includes a first electrode and a second electrode oppositely to the first electrode. At least one light-emitting functional layer is disposed between the first electrode and the second electrode. The light-emitting functional layer includes a plurality of light-emitting units. The light-emitting unit includes at least one millimeter-scale sub-pixel. Compared with the application of organic light-emitting diodes to display technology in the prior art, the embodiments of the present application apply organic light-emitting diodes to backlight technology, the light-emitting functional layer includes a plurality of light-emitting units, wherein the light-emitting unit includes at least one millimeter-scale sub-pixel, thereby reducing a process flow and a mass production difficulty of organic light-emitting diodes in the prior art, and improving a production efficiency of the OLED.

To sum up, although the present application has disclosed the above-mentioned preferred embodiments, the above-mentioned preferred embodiments are not intended to limit the present application. Those of ordinary skill in the art can make various changes and modifications without departing from the spirit and scope of the present application. Therefore, a protection scope of the present application is subject to a scope defined by the claims.

What is claimed is:

1. A display panel, comprising:
a display panel main body comprising a display region;
a backlight module positioned on a backlight side of the display panel main body and opposite to the display region, wherein the backlight module comprises:
a base substrate; and
an organic light-emitting diode disposed on a side of the base substrate close to the display panel main body, wherein the organic light-emitting diode comprises a first electrode, a second electrode oppositely to the first electrode, at least one light-emitting functional layer positioned between the first electrode and the second electrode, wherein the light-emitting functional layer comprises a plurality of light-emitting units, and wherein the light-emitting unit comprises at least one millimeter-scale sub-pixel;
wherein the light-emitting functional layer comprises a light-emitting layer, and wherein a material of the light-emitting layer comprises one of a red light-emitting material, a green light-emitting material, and a blue light-emitting material;
wherein the light-emitting unit comprises two millimeter-scale sub-pixels, and wherein the two sub-pixels have a same color;
wherein the display panel further comprises a light conversion layer positioned between the display panel main body and the backlight module, and wherein an orthographic projection of the light conversion layer on the base substrate covers the backlight module; and
wherein the light conversion layer comprises a base layer and different types of fluorescent materials uniformly dispersed on the base layer, and wherein the fluorescent materials comprise at least two of a red fluorescent material, a green fluorescent material, and a blue fluorescent material.

2. The display panel according to claim 1, wherein a material of the light conversion layer further comprises a quantum dot material, wherein the light conversion layer is disposed on the display panel main body or the backlight module.

3. The display panel according to claim 1, wherein the organic light-emitting diode comprises a plurality of the light-emitting functional layers stacked between the first electrode and the second electrode, wherein a charge generating layer is disposed between two adjacent light-emitting functional layers.

4. The display panel according to claim 3, wherein the light-emitting functional layer comprises a first common layer, a light-emitting layer, and a second common layer stacked on the first electrode.

5. The display panel according to claim 4, wherein the light-emitting unit comprises two millimeter-scale sub-pixels, and the two sub-pixels have the same color.

6. The display panel according to claim 5, wherein the plurality of light-emitting functional layers comprise a first light-emitting functional layer and a second light-emitting functional layer arranged in layers;

wherein the first light-emitting functional layer comprises a plurality of first light-emitting units, wherein the first light-emitting unit comprises two millimeter-scale first sub-pixels, wherein the second light-emitting functional layer comprises a plurality of second light-emitting units, wherein the second light-emitting unit comprises two millimeter-scale second sub-pixels, and wherein a color of the first sub-pixel is the same as a color of the second sub-pixel.

7. The display panel according to claim 5, wherein the plurality of light-emitting functional layers comprise a first light-emitting functional layer and a second light-emitting functional layer arranged in layers;

wherein the first light-emitting functional layer comprises a plurality of first light-emitting units, wherein the first light-emitting unit comprises two millimeter-scale first sub-pixels, wherein the second light-emitting functional layer comprises a plurality of second light-emitting units, wherein the second light-emitting unit comprises two millimeter-scale second sub-pixels, and wherein a color of the first sub-pixel is different from a color of the second sub-pixel.

8. The display panel according to claim 5, wherein the plurality of light-emitting functional layers comprise a first light-emitting functional layer, a second light-emitting functional layer, and a third light-emitting functional layer which are arranged in layers;

wherein the first light-emitting functional layer comprises a plurality of first light-emitting units, wherein the first light-emitting unit comprises two millimeter-scale first sub-pixels, wherein the second light-emitting functional layer comprises a plurality of second light-emitting units, wherein the second light-emitting unit comprises two millimeter-scale second sub-pixels, wherein the third light-emitting functional layer comprises a plurality of third light-emitting units, and wherein the third light-emitting unit comprises two millimeter-scale third sub-pixels; and wherein the first sub-pixel displays a first color, the second sub-pixel displays a second color, and the third sub-pixel displays a third color.

9. The display panel according to claim 1, wherein the light-emitting unit comprises two millimeter-scale sub-pixels, and wherein a distance between the two sub-pixels ranges from 0.8 mm to 8 mm.

10. A display device comprising a display panel, wherein the display panel comprises:

a display panel main body comprising a display region;

a backlight module positioned on a backlight side of the display panel main body and opposite to the display region, wherein the backlight module comprises a base substrate; and an organic light-emitting diode disposed on a side of the base substrate close to the display panel main body, wherein the organic light-emitting diode comprises a first electrode, a second electrode oppositely to the first electrode, at least one light-emitting functional layer positioned between the first electrode and the second electrode, wherein the light-emitting functional layer comprises a plurality of light-emitting units, and wherein the light-emitting unit comprises at least one millimeter-scale sub-pixel;

wherein the light-emitting functional layer comprises a light-emitting layer, and wherein a material of the light-emitting layer comprises one of a red light-emitting material, a green light-emitting material, and a blue light-emitting material;

wherein the light-emitting unit comprises two millimeter-scale sub-pixels, and wherein the two sub-pixels have a same color;

wherein the display panel further comprises a light conversion layer positioned between the display panel main body and the backlight module, and wherein an orthographic projection of the light conversion layer on the base substrate covers the backlight module; and wherein the light conversion layer comprises a base layer and different types of fluorescent materials uniformly dispersed on the base layer, and wherein the fluorescent materials comprise at least two of a red fluorescent material, a green fluorescent material, and a blue fluorescent material.

11. The display device according to claim 10, wherein a material of the light conversion layer further comprises a quantum dot material, wherein the light conversion layer is disposed on the display panel main body or the backlight module.

12. The display device according claim 10, wherein the organic light-emitting diode comprises a plurality of the light-emitting functional layers stacked between the first electrode and the second electrode, wherein a charge generating layer is disposed between two adjacent light-emitting functional layers.

13. The display device according to claim 12, wherein the light-emitting functional layer comprises a first common layer, a light-emitting layer, and a second common layer stacked on the first electrode.

14. The display device according to claim 13, wherein the light-emitting unit comprises two millimeter-scale sub-pixels, and the two sub-pixels have the same color.

15. The display device according to claim 14, wherein the plurality of light-emitting functional layers comprise a first light-emitting functional layer and a second light-emitting functional layer arranged in layers;

wherein the first light-emitting functional layer comprises a plurality of first light-emitting units, wherein the first light-emitting unit comprises two millimeter-scale first sub-pixels, wherein the second light-emitting functional layer comprises a plurality of second light-emitting units, wherein the second light-emitting unit comprises two millimeter-scale second sub-pixels, and wherein a color of the first sub-pixel is the same as a color of the second sub-pixel.

16. The display device according to claim 14, wherein the plurality of light-emitting functional layers comprise a first light-emitting functional layer and a second light-emitting functional layer arranged in layers;

wherein the first light-emitting functional layer comprises a plurality of first light-emitting units, wherein the first light-emitting unit comprises two millimeter-scale first sub-pixels, wherein the second light-emitting functional layer comprises a plurality of second light-emitting units, wherein the second light-emitting unit comprises two millimeter-scale second sub-pixels, and wherein a color of the first sub-pixel is different from a color of the second sub-pixel.

17. The display device of claim 14, wherein the plurality of light-emitting functional layers comprise a first light-emitting functional layer, a second light-emitting functional layer, and a third light-emitting functional layer which are arranged in layers;

wherein the first light-emitting functional layer comprises a plurality of first light-emitting units, wherein the first light-emitting unit comprises two millimeter-scale first sub-pixels, wherein the second light-emitting functional layer comprises a plurality of second light-emitting units, wherein the second light-emitting unit comprises two millimeter-scale second sub-pixels, wherein the third light-emitting functional layer comprises a plurality of third light-emitting units, and wherein the third light-emitting unit comprises two millimeter-scale third sub-pixels; and wherein the first sub-pixel displays a first color, the second sub-pixel displays a second color, and the third sub-pixel displays a third color.

18. The display device according to claim 10, wherein the light-emitting unit comprises two millimeter-scale sub-pixels, and wherein a distance between the two sub-pixels ranges from 0.8 mm to 8 mm.

* * * * *